United States Patent [19]
VanVonno et al.

[11] Patent Number: 5,185,292
[45] Date of Patent: Feb. 9, 1993

[54] PROCESS FOR FORMING EXTREMELY THIN EDGE-CONNECTABLE INTEGRATED CIRCUIT STRUCTURE

[75] Inventors: Nicolaas W. VanVonno; Dyer A. Matlock, both of Melbourne, Fla.

[73] Assignee: Harris Corporation, Melbourne, Fla.

[21] Appl. No.: 802,882

[22] Filed: Dec. 6, 1991

Related U.S. Application Data

[63] Continuation-in-part of Ser. No. 382,388, Jul. 20, 1989, Pat. No. 5,081,063, and a continuation-in-part of Ser. No. 613,091, Nov. 5, 1990, Pat. No. 5,071,792.

[51] Int. Cl.⁵ .................... H01L 21/44; H01L 21/48
[52] U.S. Cl. .................................. 437/180; 437/203; 437/230; 437/906; 437/974; 437/226; 437/2
[58] Field of Search ............... 437/180, 203, 230, 2, 437/3, 226, 906, 974

[56] References Cited

U.S. PATENT DOCUMENTS

| | | | |
|---|---|---|---|
| 4,188,709 | 2/1980 | Lorenze et al. | 437/180 |
| 4,788,161 | 11/1988 | Goto et al. | 437/906 |
| 5,071,792 | 12/1991 | VanVonno et al. | 437/249 |
| 5,081,063 | 1/1992 | Vonno et al. | 437/180 |

*Primary Examiner*—Brian E. Hearn
*Assistant Examiner*—Trung Dang
*Attorney, Agent, or Firm*—Evenson, Wands, Edwards, Lenahan & McKeown

[57] ABSTRACT

An edge connector is formed along a sidewall edge of a relatively thin semiconductor wafer. The wafer contains a signal processing circuit to which the edge connector is to be electrically joined. For this purpose a region of material capable of being bonded with conductive material is formed in the wafer and a trench pattern is formed in a first surface of the wafer, so as to expose a sidewall portion of the doped region. The doped region is connected to signal processing circuitry within the wafer. A metallic layer is then electroplated onto the exposed sidewall portion of the doped region. A layer of polishing resistant material, such as silicon nitride, is formed in the trench and the wafer is inverted and wax-mounted face down on a support member such that the first surface of the wafer faces the support member. The wafer is then polished as to effect a thinning of the wafer down to a level which exposes the polishing resistant material in the trench pattern. The polishing resistant material is then removed from the trench pattern, thereby leaving a plurality of spaced apart semiconductor dice that are supported by way of the support member. The dice are then removed from the support member by melting the wax. The thinned edge-connectable wafer may then be attached at its sidewall edges to conductive land portions of a separate substrate, such as one containing a focal plane array.

30 Claims, 10 Drawing Sheets

PROCESS FOR FORMING EXTREMELY THIN EDGE-CONNECTABLE INTEGRATED CIRCUIT STRUCTURE

CROSS REFERENCE TO RELATED APPLICATIONS

The present application is a continuation-in-part application of co-pending U.S. patent applications Ser. No. 382,388, filed July 20, 1989, now U.S. Pat. No. 5,081,063 entitled "Edge-Connected Integrated Circuit Structure," by Nicolaas Van Vonno et al, assigned to the assignee of the present application and the disclosure of which is incorporated herein, and U.S. Ser. No. 613,091, Nov. 5, 1990, now U.S. Pat. No. 5,071,792 entitled "Process For Forming Extremely Thin Integrated Circuit Dice," by Dyer Matlock et al, assigned to the assignee of the present application and the disclosure of which is incorporated herein.

FIELD OF THE INVENTION

The present invention relates in general to the manufacture of semiconductor devices and is particularly directed to a scheme for providing edge-connections on an extremely thin integrated circuit-containing wafer and separating the thin wafer into individual dice for interconnection to an adjacent semiconductor structure.

BACKGROUND OF THE INVENTION

The above-referenced co-pending U.S. patent application Ser. No. 382,388, describes a semiconductor processing technique for manufacturing an edge-connectable integrated circuit structure, in which a substantially planar semiconductor substrate that contains a densely compacted arrangement of semiconductor devices, such as a photodiode array, is interconnected with side edge portions of a plurality or stack of extremely thin semiconductor wafers in which signal processing electronics for the arrangement are formed. For this purpose, the rear surface of the substrate is provided with an array of conductive bumps associated with the physical disposition of the photodiodes, which bumps are to be conductively joined with corresponding metallic bumps along side edge portions of the stack of thin wafers that contain the signal processing electronics.

The inability to use conventional photolithographic processing to form the interconnect bumps along side edges of the wafer is successfully remedied in accordance with the invention detailed in the '388 application by forming trenches in the semiconductor wafer material that intersect doped semiconductor regions of the wafer's signal processing circuitry. The required metallic bumps to be mated with those of the photodiode array are then electroplated on the exposed side edge surfaces of the doped semiconductor regions in the trench portions of the wafer. After this electroplating process, the wafer is backlapped, for example by mechanical grinding and/or chemical etch, until the material removal plane intersects the trench and thereby severs the 'thinned' wafer into separate dice, each of which has a row of side edge-connection bumps for connection with corresponding bumps of the substrate. The severed dice may then be robotically seized, transported into adjacent alignment with and then conductively joined to the bumps of the substrate, with each signal processing die being oriented orthogonally to the planar surface of the substrate such that its side edge bumps are connected to the bumps of the photodiode-containing substrate.

Advantageously, the side edge processing technique described in the '388 application makes it possible to house all of the signal processing electronics for an individual row of photodiodes of a focal plane array in a single, relatively thin wafer having a thickness on the order of only one to two mils, so that the individual light responsive elements of the focal plane array can be of reduced size, thereby providing a considerably enhanced resolution optical signal processor. For example, for a 128×128 photodiode array, a two mil thickness of an individual die results in an array resolution of less than two mils per pixel, which is an order of magnitude smaller of that of a conventional printed circuit board approach.

Now although the trench sidewall electroplating mechanism described in the '388 application facilitates forming edge connections on a very thin wafer, which is desirable from a packaging standpoint, the wafer itself is fragile and subject to breaking when handled or processed by conventional methods. In particular, as described in the above-referenced '091 application, when a very thin processed wafer has been separated into individual dice, and its underlying handle layer is then removed, leaving only the thin wafer and an adjoining (oxide) layer, handling of the resulting structure (which may have a diameter up to five inches) is very difficult and may damage the individual devices.

SUMMARY OF THE INVENTION

In accordance with the present invention, the technique described in the '091 application for solving this thinned wafer handling problem is used to augment the side edge electroplating process described in the '388 application, so that an extremely thin wafer having side edge connectability is able to be separated into a plurality of completed circuit-containing dice without having to handle the wafer in a considerably thinned condition. In accordance with the application of the first embodiment of the invention described in the '091 application to the process described in the '388 application, after the wafer has been processed so as to electroplate side edge metallic bumps onto doped semiconductor regions exposed at sidewalls of the trench pattern (the depth of which defines the desired thickness of the die, on the order of one to five mils, for example), a layer of a relatively hard material, namely one that has a resistance to polishing greater than that of the wafer, is non-selectively formed on the wafer including the trench, so that it coats the bottom and sidewalls of the trench, but does not necessarily fill the trench. For a silicon wafer, a material such as silicon nitride or silicon carbide is suitable for this purpose. This polishing resistant layer is then planarized down to the top surface of the wafer. The wafer is then affixed facedown on a separate flat support handle by means of a temporary attachment material such as wax. With the wafer mounted in its inverted configuration, its thickness is then reduced down to the bottom of the trench where the nitride is encountered. The trench nitride material is then etched away, thereby separating the thinned wafer into a plural y of semiconductor dice that are supported by way of the handle. The individual dice may then be separated from the support handle by melting the wax.

Pursuant to the use of the second technique described in the '091 application, after a passivating overcoat layer has been formed on a first surface of the semiconductor wafer in which a plurality of integrated circuit components have been formed, a trench pattern is formed and trench sidewall bumps are electroplated on exposed doped regions of the wafer as described in the '388 application. The trench pattern is then completely filled with a hard trench fill material After wafer probe testing, the wafer is affixed, face-down, to a planar support handle by way of a readily removable adhesion material such as wax. The thickness of the wafer is then reduced by mechanical polishing its back surface down to a level which exposes the trench fill material The trench fill material is then removed from the trench pattern, thereby dividing the wafer into a plurality of semiconductor dice that are supported by way of the handle. By melting the wax the dice are separated from the handle, as in the first embodiment.

As described in the '091 application, in accordance with a third embodiment (which is a modification of the second embodiment), the fill material in the trench may be formed by non-selectively depositing a first thin buffer layer on the patterned wafer, followed by the non-selective deposition of a second layer of fill material which completely fills the remainder of the trench pattern. The fill material is then planarized down to the surface of the passivating layer, so that the fill material remains only in the trench. When such a multiple fill material is employed, the first layer of fill material may comprise a nitride layer and the second layer may comprise silicon carbide After the face-down mount and backside removal of the original substrate down to the level of the polishing-stop material in the trench, the dice may be removed by etching the first layer of fill material, so that the second layer of fill material may be lifted out, thereby separating the wafer into a plurality of dice.

In applying a fourth embodiment of the wafer handling, die separation process described in the '091 application to the side edge connection process of the '388 application, the thin wafer layer has a buried insulator layer formed beneath the integrated circuit components that have been introduced through the top surface of the wafer, and a support substrate underlies the buried insulator layer. The trench pattern is formed through the circuit passivating layer and through the wafer down to the buried insulator layer. After the side edge bumps have been electroplated in the trench pattern, a layer of wax is non-selectively deposited over the patterned structure, the wax filling the trench. The waxed structure is then mounted face-down on a separate, flat support handle. The support handle is then thinned by, for example, a grind/polish/etch step down to the buried insulator layer. This buried insulator layer effectively performs the same polish stop function as the trench-resident material in the previous embodiments. The buried insulator layer is then etched off, exposing the trench wax matrix. By heating the handle, the wax is softened, so that the dice may be easily lifted out.

In accordance with a modification of this latter embodiment of the invention, in which a buried insulator layer is formed beneath said integrated circuit components in the thin wafer layer, after forming a trench pattern through the passivating layer and the wafer layer down to the buried insulator layer and electroplating sidewall metallic bumps on exposed regions in the trench, etch resistant material is selectively formed on both the passivating layer and on the sidewalls of the trench pattern, leaving a floor portion of the trench pattern which exposes the buried insulator layer. An etchant is then applied to the buried insulator layer by way of the exposed floor portion of the trench pattern, so as to etch away the buried insulator layer and thereby lift off the plurality of dice from the support substrate beneath the buried insulator layer. Preferably, the buried insulator layer is doped with impurities which accelerate the etching of the buried insulator layer. For this purpose, the buried insulator layer may comprise an oxide layer heavily doped with phosphorus and the etchant may be comprise a concentrated hydrogen fluoride etchant solution. By immersing the structure resulting from the formation of the etchant resistant material on the sidewalls of the trench pattern in an etchant solution, the buried insulator layer is etched by way of the exposed floor portion of the trench pattern, thereby separating the plurality of semiconductor dice from the support substrate beneath the buried insulator layer.

DETAILED DESCRIPTION

Figure 1:
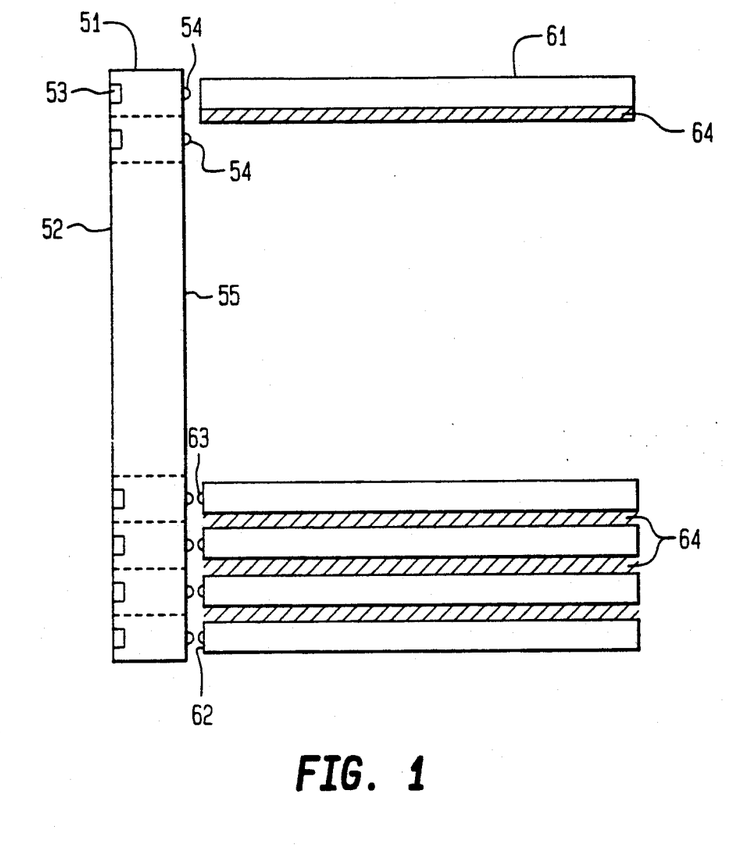
FIG. 1 is a diagrammatic side view of an embodiment of an opto-electronic imaging system employing a stacked plurality of edge-connected circuit die in accordance with the invention described in the above-referenced '388 application.

Referring now to FIG. 1, a diagrammatic side view of an embodiment of an opto-electronic imaging system in accordance with the invention described in the above-referenced '388 application is shown as containing a first semiconductor (e.g. silicon) substrate 51 having formed in a first, effectively planar, image-receiving surface 52 thereof an array or matrix of rows and columns (one row of which is shown in the Figure) of photoresponsive devices (e.g. photodiodes) 53. Each photodiode is conductively coupled to an associated conductive land portion or 'bump' 54, that extends from a second surface 55 of the substrate, so that second surface 55 contains a matrix of such bumps that are electrically coupled with respective ones of photoresponsive devices 53. Because imaging surface 52 is dedicated to supporting only the photoresponsive devices, the resolution of the focal plane array is theoretically limited only by the packing density and size of the individual photodiodes themselves, there being no other signal processing or inter-chip connectivity components distributed over surface 52. Disposed adjacent and orthogonal to rear surface 55 of substrate 51 is a parallel arrangement of a plurality of second, signal processing semiconductor substrates 61, each of which is associated and in alignment with a respective row of the bumps 54 to which the matrix of photodiodes 53 is connected. As will be described in detail below, each substrate 61 contains semiconductor regions that are interconnected to form signal processing devices (e.g. amplifiers, integrators, filters, multiplexers, etc.) for processing the outputs of an associated row of photodiodes, and has electroplated along a side or edge portion 62 a plurality of metallic bumps 63, which are conductively connected through regions of doped semiconductive material to the signal processing devices of the substrate. A row of conductive bumps 63 that extends along the side or edge portion 62 of a respective signal processing substrate 61 is conductively joined to a row of corresponding conductive bumps 54 along the rear surface 55 of photodiode chip 51 by conventional beam lead bonding techniques, such as pressure bonding, solder reflow, etc.

The thickness of an individual signal processing substrate 61, being on the order of only one to two mils, permits a very compact integration of high resolution photoelements within the photodiode chip 51 (as the edge of the signal processing substrate 61 effectively defines the physical the bounds of a photodiode). Thus, for a row of 128 photodiodes, a size of two mils per element means that a laminate of 128 signal processing substrates 61 (adjacent ones of which are separated by a thin buffer layer 64 of insulator material (e.g. epoxy resin)) will occupy a perimeter less than 300 mils, or less than an order of magnitude smaller than the same dimension of a conventional circuit board array.

The sequence of steps through which a respective signal processing substrate 61 is processed to obtain a side connection or bump, that permits the substrate to be edge-connected to an adjacent photodiode in the manner diagrammatically illustrated in FIG. 1 will now be described with reference to FIGS. 2-10. In the course of this description it is to be understood that the processing of the remainder of the substrate to form the device regions and interconnections of those device regions of the signal processing components are conventional and not, per se, part of the present invention. Consequently, details of their specific structure and the processing steps through which such components may be formed will not be described here. Suffice it to say that a respective signal processing substrate 61 is assumed to contain a plurality of such interconnected devices and has an input interconnect terminal (either by way of surface interconnect or buried layer interconnect) to which an electrode layer for coupling an external connection terminal may be joined.

Figure 2:
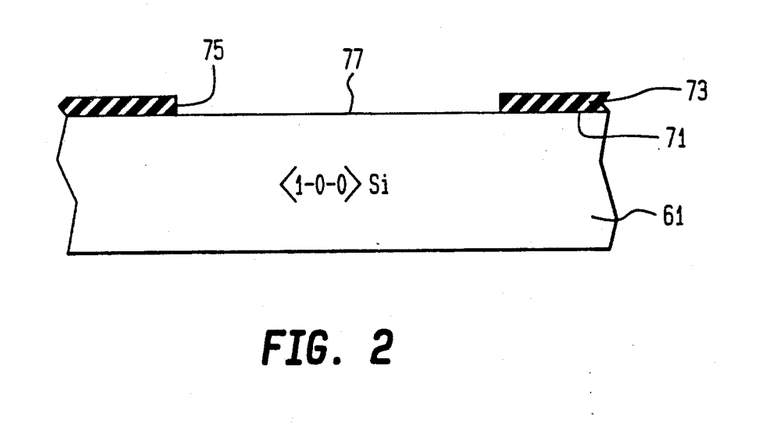
FIGS. 2–8 diagrammatically show a cross-section of a semiconductor substrate during the course of the side edge connection manufacturing process described in the above-referenced '388 application.

With reference now to FIG. 2, there is shown a semiconductor substrate 61 (e.g. a several mils thick wafer of silicon) on a planar (e.g.[100] crystalline plane) surface 71 of which a dielectric layer 73 of silicon oxide or other conventional insulator material is selectively formed (e.g. photoresist-patterned) to leave an aperture or window 75, exposing a surface portion 77. For the application to the process to the particular structure of a row of multielement components, there will be a plurality of spaced-apart apertures 75, each of which may have a generally rectangular shape, extending in a line into the plane of the Figure. FIG. 2 and subsequent illustrations in FIGS. 3-10 show the processing for only a single element. It should be noted that the length of aperture 75 is sufficient to permit the introduction of a mechanical trench-forming element, such as a diamond saw blade, for subsequent removal of material from (a pocket in) the underlying substrate, while still leaving a substantial length of surface area available for formation of a conductive region.

Figure 3:
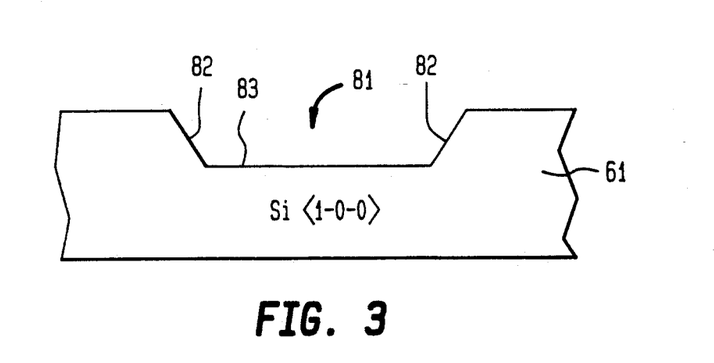
Figure 4:
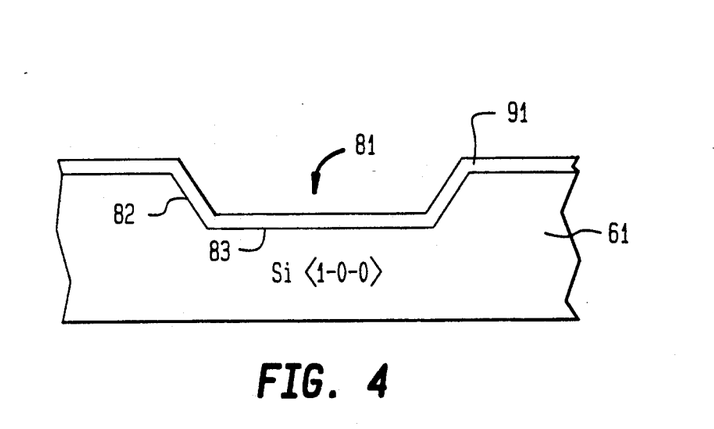

Using aperture 75 in dielectric layer 73 as an etch window, exposed surface region 77 is anisotropically etched, using a conventional wet chemical etch, to thereby form a depression or recess 81 which extends into substrate 61 from top surface 77 and is bounded by sidewalls 82 (to a depth on the order of one mil) terminating at a bottom surface or floor 83, as shown in Figure 3. After formation of depression 81, oxide layer 73 is stripped from substrate surface 71 and then the entire exposed surface of the substrate, including depression 81, is reoxidized to form a (silicon dioxide) dielectric layer 91 that is contiguous with the top surface 71 of substrate 61, as well as sidewalls 82 and floor 83 of depression 81, as shown in FIG. 4. As an alternative to anisotropic etching in a wet chemical etch, a dry etching method may be employed. This etch will result in a depression or recess with straight (i.e. normal to the surface) sides, which can then be processed as defined for the wet etch methodology.

Following substrate reoxidation, a layer 95 of heavily doped (N+) polysilicon is non-selectively deposited over oxide layer 91, sufficient to fill depression 81. The polysilicon layer 95 (and underlying oxide layer 91) is then removed (e.g. by etching or grinding) back to the original surface 71 of the substrate, as shown in FIG. 5, to leave a dielectric-isolated pocket or island 95 of polysilicon, the exposed top surface 97 of which is effectively coplanar with top surface 71 of substrate.

Figure 5:
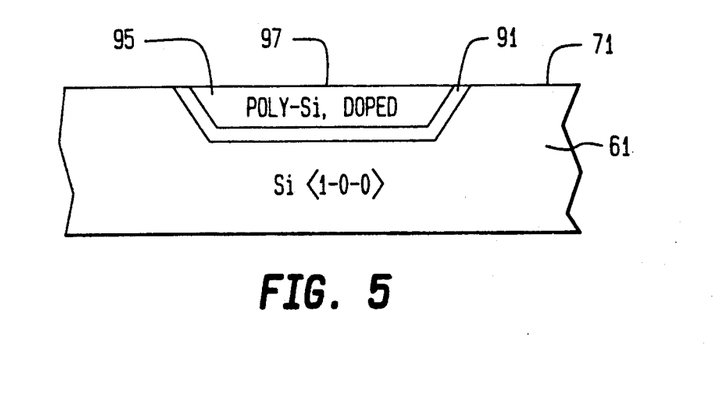

Using the structure shown in FIG. 5, the wafer is then processed to form and interconnect symmetrically arrayed sets (to the left and right of pocket 95 as viewed in the Figures) of device regions (diagrammatically shown at 101 in FIG. 6) of a pair of signal processors, including the formation of a surface passivation layer 103 and interconnect electrode layers 105. In the course of this fabrication process, impurities are introduced into the top surface 97 of pocket 95, so as to form a heavily doped (N+) surface region 111. Heavily doped region surface region may extend partially into pocket 95 or throughout the entire extent of pocket 95. Where pocket 95 is of P or P+conductivity type, region 111 forms a PN junction with the opposite conductivity type material of pocket 95. For purposes of the present description, heavily doped region 111 may be considered to extend completely through pocket 95 down to dielectric layer 91. At spaced apart surface portions 112, 114 of heavily doped region 111 a pair of (indium) electrodes 113 and 115 are formed, through apertures in an overlying dielectric (oxide) layer 117. As will be described below, electrodes 113 and 115 are used during the bump electroplating of severed side portions of heavily doped region 111 and, in addition, provide surface interconnect from the heavily doped region 111 to the signal processing regions in the remainder of the substrate.

Figure 6:
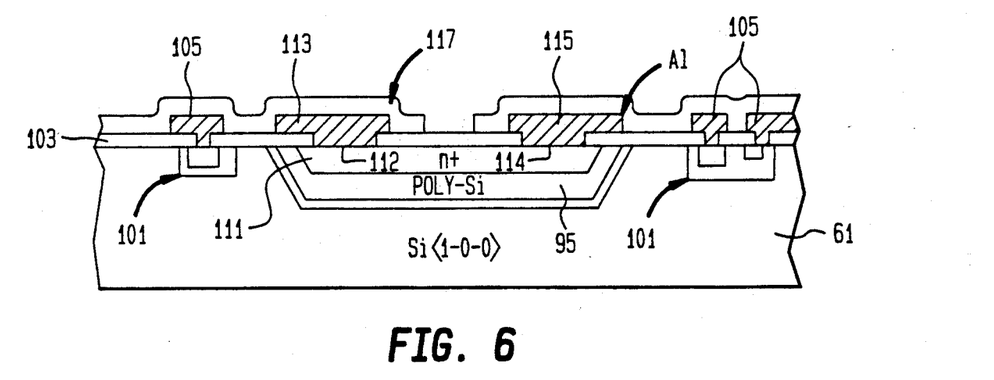
Figure 7:
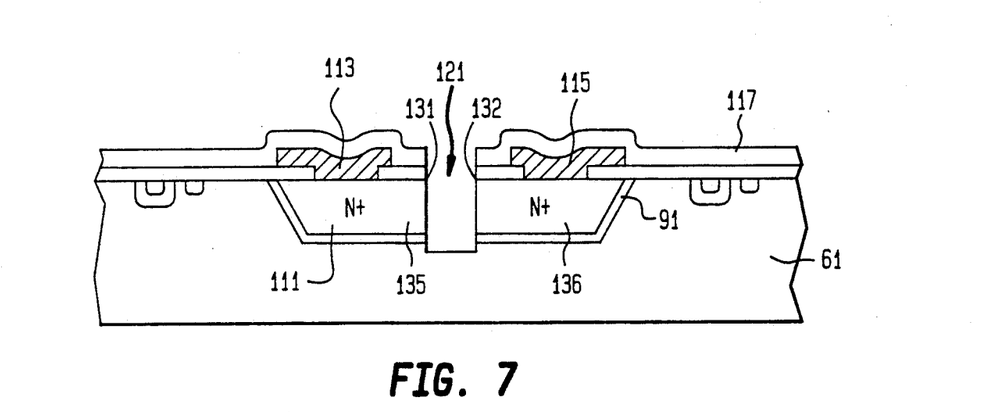

Following device region processing and connection of electrodes 113 and 115 to spaced apart surface portions of heavily doped (N+) region 111, producing the configuration shown in FIG. 6, a trench 121 is patterned into the top surface of the substrate to a depth of the desired final thickness of the wafer, in accordance with one of the embodiments employed in the above referenced '091 application. The trench extends through the bottom floor of pocket 95 and exposes a pair of sidewall portions 131 and 132 of heavily doped (N+) region 111, which has now been cut or severed into respective heavily doped (N+) regions 135 and 136, that are contacted by electrodes 113 and 115, as shown in FIG. 7.

Figure 8:
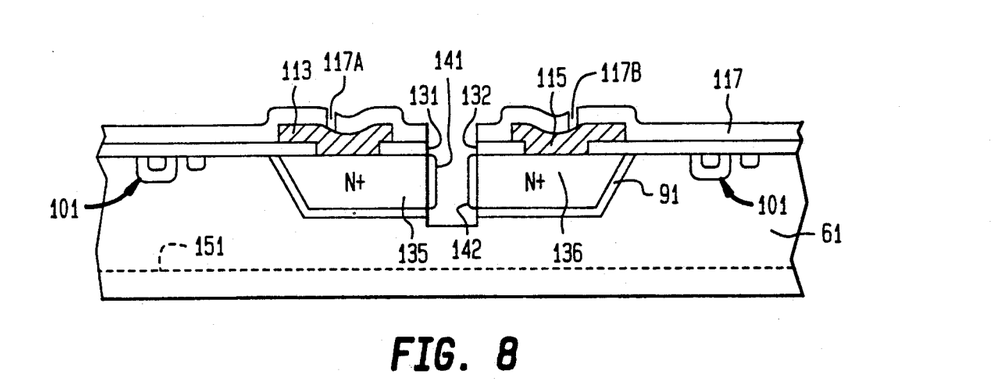

Next, via apertures 117A, 117B through dielectric layer 117, electroplating probes (not shown) are contacted with electrodes 113, 115, respectively and the substrate is immersed in an electroplating solution, such as gold cyanide. Through these electroplating probes, each of electrodes 113 and 115 is connected to the negative potential electrode of an electroplate power supply, the positive potential electroplate electrode of which is immersed in the electroplate solution, so as to cause raised land portions or bumps 141 and 142 to be plated onto the exposed side portions 131 and 132 of regions 135 and 136, respectively, as shown in FIG. 8. In the present example, since heavily doped regions 135, 136 extend completely through pocket 95, the bumps 141, 142 are plated all the way down to the dielectric layer 91. Where heavily doped regions 135, 136 are formed in only a portion of a P+pocket, the bumps will be selectively plated only upon the exposed sidewall portions of regions 135, 136, so that the bumps will not extend over the entirety of the exposed sidewalls of trench 121. Similarly, in the case where regions 135, 136 extend only partially into P+pocket it may be desired to plate bumps upon sidewall portions of the P+pocket beneath regions 135, 136. In this case, surface electroplating contact may extend through dielectric layer 117 (which covers electrodes 113, 115) to contact the P+material of pocket 95. In this instance bumps would be electroplated along the exposed sidewalls of P+pocket 95 beneath N+regions 135, 136.

The height or thickness of each bump will depend upon conventional electroplate parameters, such as type and strength of solution, electroplate voltage, time of application, etc. and will not be detailed here, as they are not necessary for understanding and carrying out the present invention. Indeed, electroplate processing steps conventionally employed for planar surface electrode formation may be used. What is essential is that sidewall portions of doped regions be exposed by the trenches, which are capable of providing a growth site for the spaced apart rows of bumps 141 and 142 that are to be used for achieving the intended edge connection of each signal processing substrate 61 to a corresponding row of bumps 54 on the backside of the photodiode chip 51 (FIG. 1).

After completion of the electroplating process, the thickness of the wafer 61 is reduced until the material removal plane (shown by broken line 151 in FIG. 8) intersects the bottom of the trench 121, for the purpose of severing the 'thinned' substrate into separate dice, each of which has a row of edge-connection bumps 141/142 corresponding to bumps 63, shown in FIG. 1. Pursuant to the present invention, the thickness of the plated-trench wafer is reduced by taking advantage of the various embodiments of the wafer separation and handling methodology detailed in the above-referenced '091 application.

Figure 9:
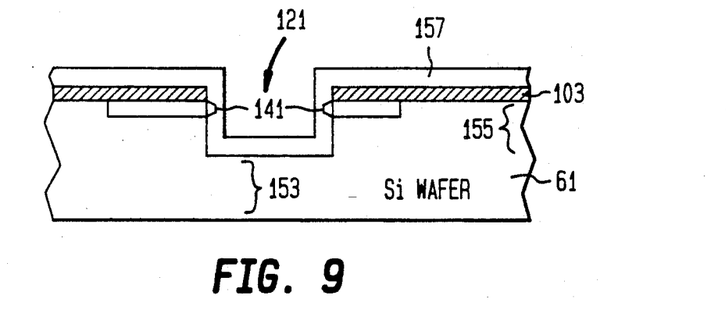
FIGS. 9–12 are diagrammatic cross-sections of a bump-plated trench-patterned semiconductor wafer at respective steps of thinning and die separation in accordance with a first embodiment of the methodology of the above-referenced '091 application.

More particularly, FIGS. 9-12 diagrammatically show cross-sections of a wafer 61, containing a plurality of trenches that have been sidewall-electroplated, as shown in FIG. 8, at respective steps of the wafer thinning process employing the first embodiment of the scheme described in the '091 application. FIG. 9 shows the wafer 61 of sufficient thickness to form a handle region 153 beneath a thin portion 155 of the wafer 61 in which device regions (e.g. regions 101 shown in FIG. 8) and the electroplated bumps 141 have been formed. A layer 157 of a relatively hard material, namely one that has a resistance to mechanical polishing greater than that of the wafer, is non-selectively deposited over the electroplated, trench-patterned wafer to a thickness on the order of one mil. For a silicon wafer, a material such as silicon nitride or silicon carbide is suitable for this purpose. It should be observed that these materials are given as non-limiting examples, and other materials having like functional properties may be used.

Figure 10:
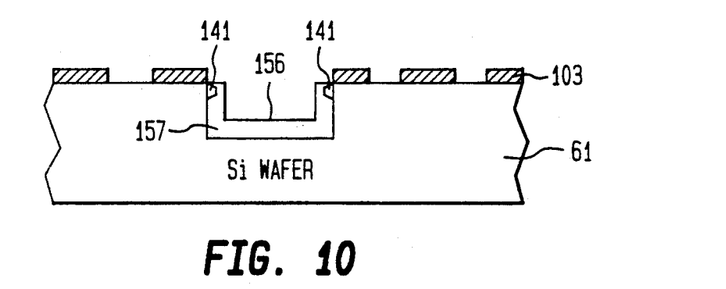

Polishing resistance layer 157 is then planarized by selective etching, so as to remove the material from surface passivating layer 103, but leaving layer 157 partially filling the trench pattern, denoted by trench coat portions 156 and 158, which are deposited on the floor and sidewall portions of the trench pattern, as shown in FIG. 10. Surface passivating layer 103 may be selectively patterned at this time to form a plurality of apertures which to expose surface regions of integrated circuit components for wafer-probe testing of the devices.

Figure 11:
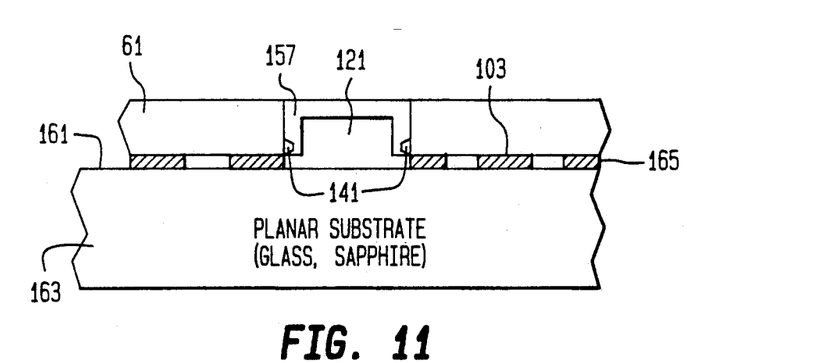

After the circuits have been tested, wafer 61 is inverted, as shown in FIG. 11 and, using conventional beam-lead attachment techniques, affixed face-down on the planar surface 161 of a support member (handle) 163, such as glass or sapphire. One standard attachment material is a thin film 165 of heated wax, which provides temporary adhesion between surface passivating layer 103 and the planar surface 161 of support handle 165. With wafer 161 mounted in its inverted configuration, its thickness is then reduced by a conventional mechanical grind/lap and polish sequence (which may be followed by a suitable KOH etch) that 'thins' inverted wafer 61 down to the trench nitride layer 157. Because layer 157 is a hard, dense material, upon being encountered during the polishing operation, it significantly retards further removal of the wafer material, so that (nitride) layer 157 acts as a polishing stop. At this point in the process, the thickness of wafer 61 is that desired (corresponding to the trench depth).

Figure 12:
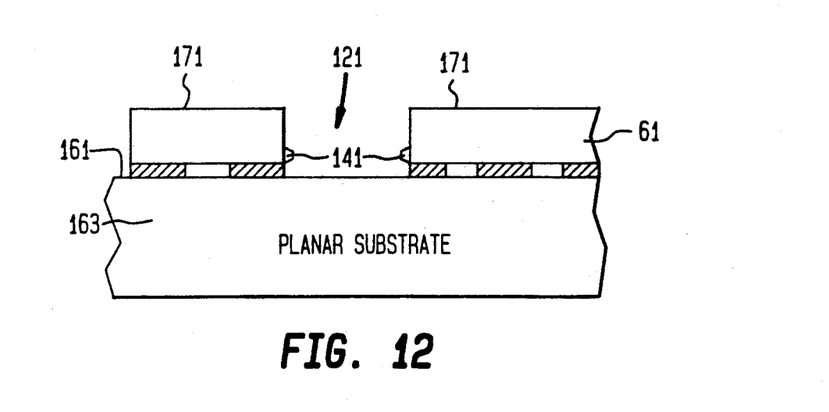

The lap and polish stop layer 157 is then removed (e.g. in the case of a nitride layer by a nitride etch), thereby effectively 'cleaning out' the trench pattern 121, as shown in FIG. 12, so that a plurality of semiconductor dice 171 are separated from one another and supported by way of handle 163. The individual dice 171 may now be readily separated from the support handle by simply melting wax film 165.

Figure 13:
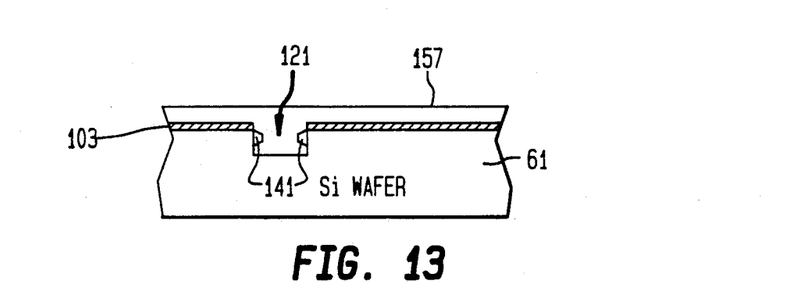
FIGS. 13–16 are diagrammatic cross-sections of a bump-plated trench-patterned semiconductor wafer at respective steps of thinning and die separation in accordance with a second embodiment of the methodology of the above-referenced '091 application.
Figure 14:
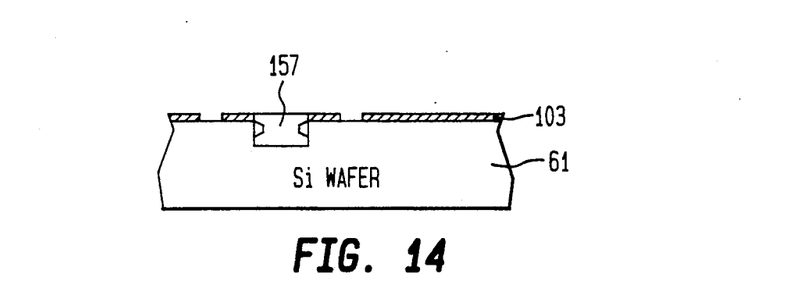

The application of the second embodiment of the wafer thinning and severing process described in the '091 patent to a trench sidewall plated wafer is diagrammatically shown in Figures 13-16. As in the first embodiment, a layer 157 of polish resistant material, such as any of those referred to above, is non-selectively deposited over the trench-patterned wafer 61. Unlike the first embodiment, in which polish resistance layer 157 was deposited to only partially fill the trench pattern, here layer 157 is deposited to a thickness sufficient to completely fill the trench, as shown in FIG. 13. Layer 157 is then planarized by a conventional etch back process, such as wet etch, plasma etch, reactive ion etch, etc., so as to perform a smooth etching of the layer down to the surface of surface passivating layer 103, leaving polish-resistant layer 157 effectively co-planar with the top surface 104 of passivating layer 103, as shown in FIG. 14. Surface passivating layer 103 may then be selectively patterned to form a plurality of apertures which to expose surface regions of integrated circuit components (not shown for clarity) for wafer-probe testing of the devices.

Figure 15:
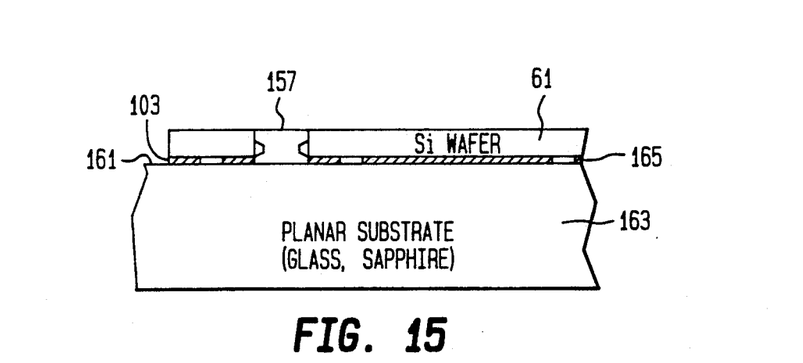

After the circuits have been tested, wafer 61 is inverted and, as shown in FIG. 15, mounted face-down on the planar surface 161 of a support handle 163, using a suitable adhesion material, such as a wax film 165, as in the previous embodiment. The thickness of mounted wafer 61 is then reduced, for example, by a mechanical grind/lap and polish sequence that thins the wafer down to the trench fill layer 157. Again, since layer 157 is a hard, dense material, upon being encountered during the polishing operation, it significantly retards removal of the wafer, so that it acts as a grind/polish stop. At this point in the process, the thickness of the wafer corresponds to the trench depth.

Figure 16:
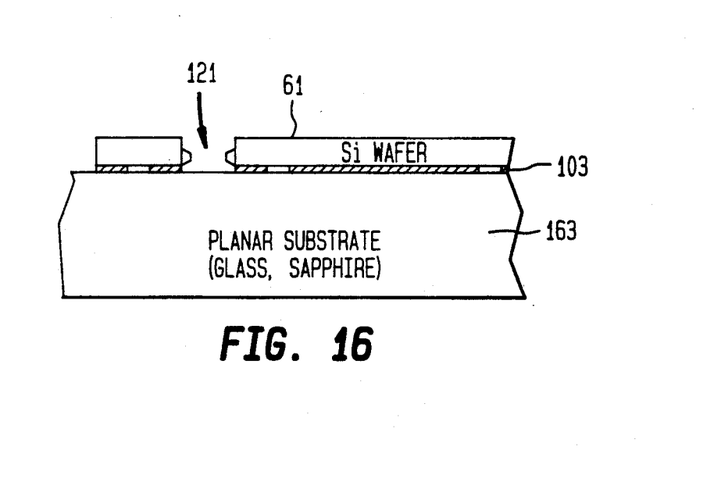

Once the thinning process is complete, trench fill layer 157 is removed by a trench etch, thereby effectively cleaning out the fill material from the trench pattern, so that a plurality of spaced-apart semiconductor dice 171 remain supported by way of handle 163, as shown in FIG. 16. The individual dice 171 may now be readily separated from the support handle by simply melting wax film 165.

Figure 17:
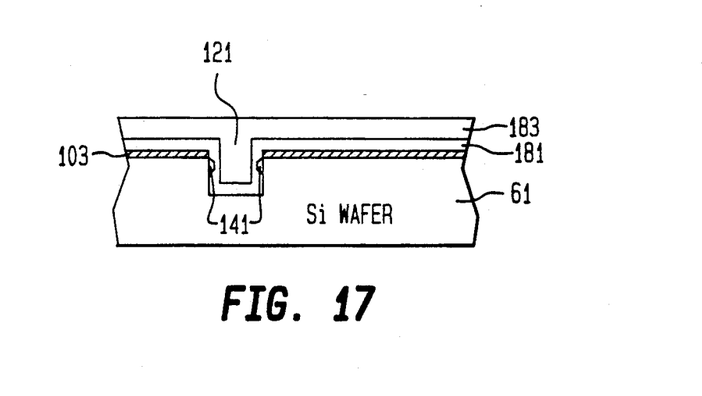
FIGS. 17–20 are diagrammatic cross-sections of a bump-plated trench-patterned semiconductor wafer at respective steps of thinning and die separation in accordance with a third embodiment of the methodology of the above-referenced '091 application.

The application of a third second embodiment of the wafer thinning and severing process described in the '091 patent to a trench sidewall-plated wafer is diagrammatically shown in Figures 17-20. Unlike the first and second embodiments, in place of a single polish stop trench deposit, an initial buffer layer 181, such as silicon nitride, is non-selectively deposited over the sidewall electroplated, trench-patterned wafer, prior to depositing a trench fill layer 183, such as silicon carbide or tungsten. The buffer layer 181 may have a thickness on the order of 3000 to 5000 Angstroms. Depositing buffer layer 181 prior to filling the trench pattern with the polish stop material allows for the removal of the polish stop layer from the trench pattern in the event no satisfactory selective etch chemistry (etch stop material to silicon) is available during subsequent processing. As in the second embodiment, trench fill layer 183 is deposited to a thickness sufficient to completely fill the trench, as shown in FIG. 17.

Figure 18:
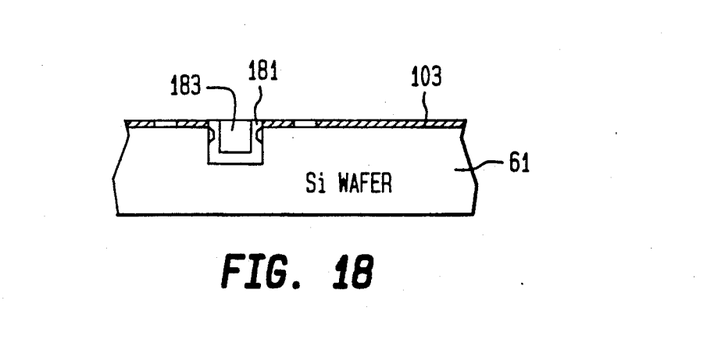

The level of the resulting surface laminate of layers 181 and 183 is then reduced down to the surface of the surface passivating layer 103, leaving layer 183, even with the top surface of passivating layer 103, as shown in FIG. 18. Surface passivating layer 103 may then selectively patterned to form wafer probe apertures for testing of the circuitry of the wafer.

Figure 19:
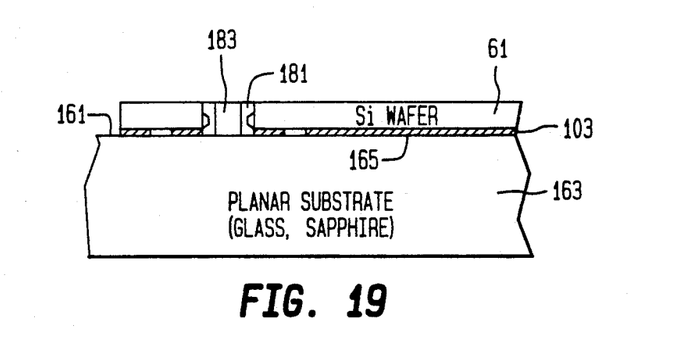
Figure 20:
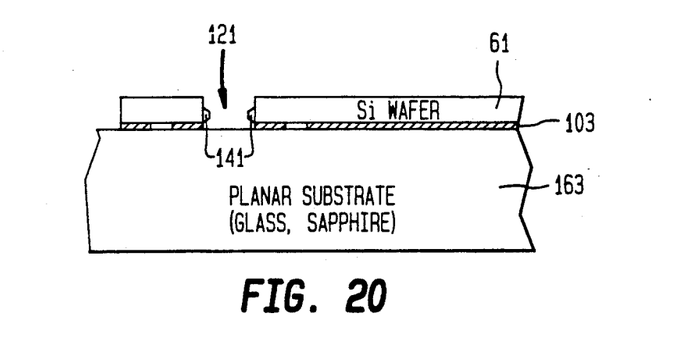

After the circuits have been tested, wafer 61 is inverted and, as shown in FIG. 19, mounted face-down on the planar surface 161 of a support handle 163, using a suitable adhesion material, such as a wax film 165, as in the previous embodiments. The thickness of mounted wafer 61 is then reduced by a mechanical grind/lap and polish sequence that thins the wafer down to the trench fill polishing stop material 183. Once the thinning process is complete, the nitride buffer layer 181 is etched away, causing tungsten fill layer 183 to be lifted out, leaving plural spaced-apart semiconductor dice 171 supported by way of handle 163, as shown in FIG. 20. The individual dice 171 may now be readily separated from the support handle by melting wax film 165.

Figure 21:
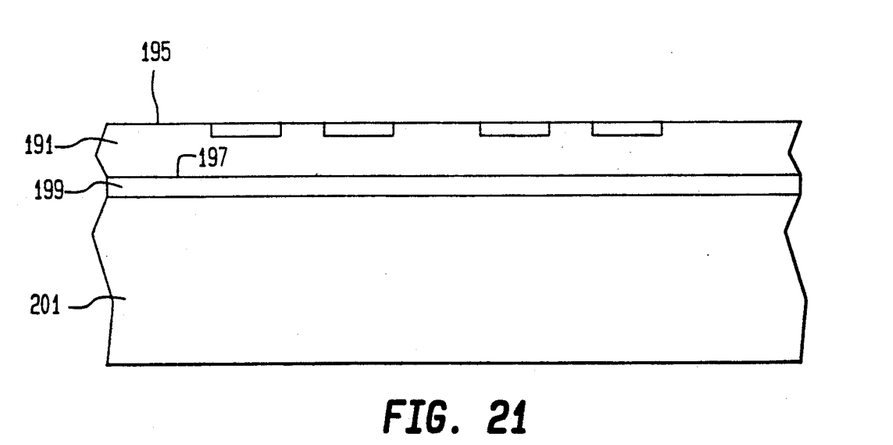
FIGS. 21–25 diagrammatic cross-sections of a bump-plated trench-patterned semiconductor wafer at respective steps of thinning and die separation in accordance with a fourth embodiment of the methodology of the above-referenced '091 application.

In each of the above-described embodiments of the invention the semiconductor wafer was obtained by thinning a bulk substrate. In accordance with a fourth embodiment, diagrammatically illustrated in FIGS. 21-25, the wafer is originally formed as a thin wafer layer atop buried insulator layer (e.g. oxide layer) within a substrate structure. More particularly, as shown in FIG. 21, a relatively thin (one to five mils) planar layer 191, having a plurality of circuit regions 193 formed in its top planar surface 195, is contiguous, at its bottom surface 197, with a buried insulator (e.g. oxide) layer 199. Buried oxide layer 199 is contiguous with an underlying support substrate 201. Buried oxide layer 199 and planar layer 191 may be formed by a number of conventional techniques, including, but not limited to, wafer bonding, oxygen ion implantation (SIMOX processing), or zone-melt recrystallization, with epitaxial silicon growth to bring the layer to its final thickness. Its thickness may lie in a range of 5000 to 10,000 Angstroms. In each case, the depth at which oxide layer 199 is buried will define the thickness of layer 191 and thereby the eventual die thickness. Because buried oxide layer 199 covers the entire bottom surface 197 of wafer laye 201, it will effectively serve as an etch stop during the thinning process to be performed. This not only improves the precision of the thinning process, but makes tight control of the variations in the etch process less critical.

Figure 22:
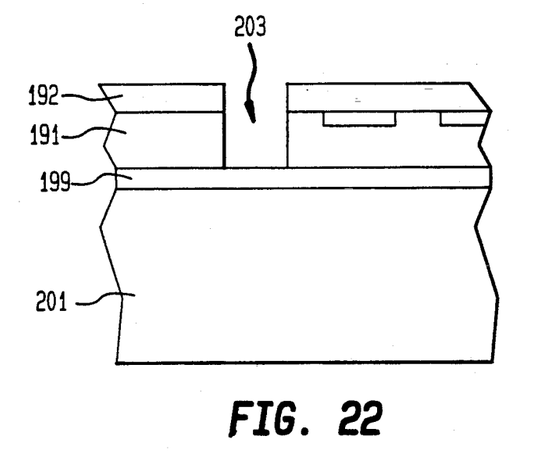
Figure 23:
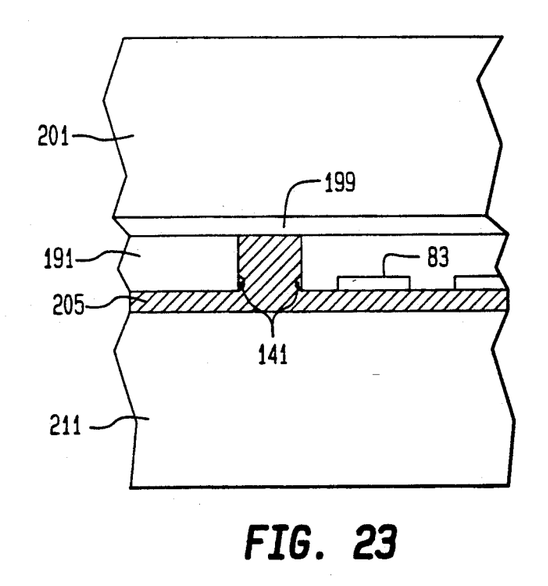

As in the previous embodiments, sidewall bumps 141 are electroplated to exposed sidewall edges of doped wafer regions that are intersected by a the trench pattern 203, trench pattern 203 extending completely through passivating layer 192 and layer 191 down to buried insulator layer 199, as illustrated in Figure 22. Because buried oxide layer 199 serves as the polishing stop, it is unnecessary to fill the trench pattern 203 with a stop material. Instead, the entire top surface of the structure shown in FIG. 22 is non-selectively waxed (the wax layer 205 filling trench pattern 203) and the resulting structure is mounted facedown on a support handle 211, as shown in FIG. 23.

Figure 24:
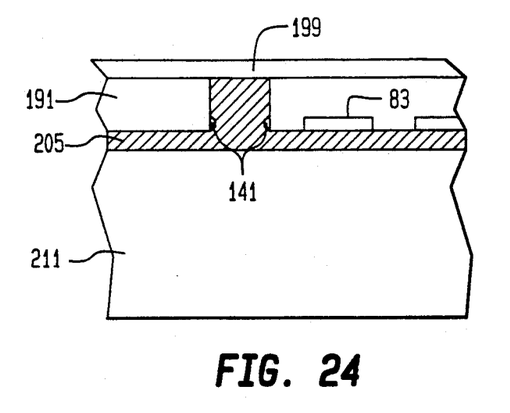
Figure 25:
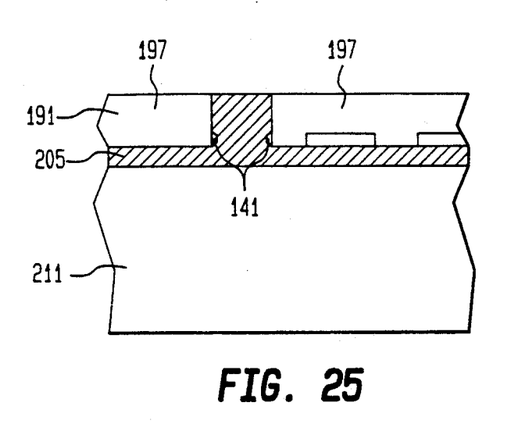

As illustrated in FIG. 24, substrate 201 is (mechanically and chemically) polished down to buried insulator layer 199 which effectively acts as a polish stop, as does the nitride layer in the previous embodiments. Oxide layer 199 is then etched off, for example by means of a conventional buffered HF etch, leaving a plurality of integrated circuit dice 197 embedded in a wax matrix, as shown in FIG. 25. The dice may then be removed by heating the support handle 211, which softens the wax so that the dice may be pulled out of the matrix.

Figure 26:
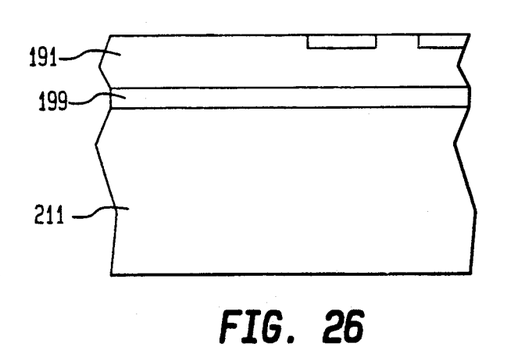
FIGS. 26–28 are diagrammatic cross-sections of a bump-plated trench-patterned semiconductor wafer at respective steps of thinning and die separation in accordance with a fifth embodiment of the methodology of the above-referenced '091 application.
Figure 27:
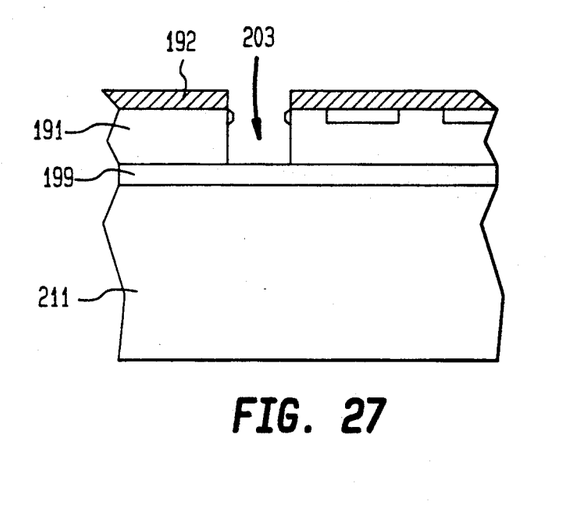
Figure 28:
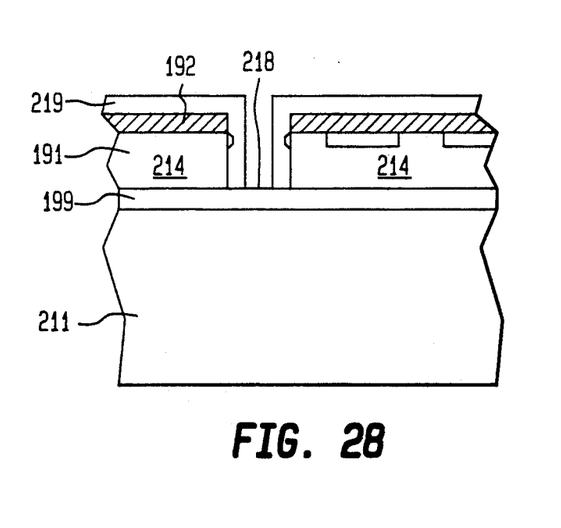

The application of a fifth embodiment of the wafer thinning and severing process described in the '091 patent to a trench sidewall plated wafer is diagrammatically shown in FIGS. 26-28, wherein the configuration of the semiconductor structure again has a buried insulator layer 199 formed beneath a thin surface layer 191 containing integrated circuit components in its top planar surface 205 (FIG. 26). In the present embodiment, however, buried insulator layer 199 is preferably doped with an etch accelerator, such as phosphorus. As in the fourth embodiment, sidewalls of a trench pattern 203 formed through surface passivating layer 192 and through layer 191 down to buried oxide layer 199 are electroplated with metallic bumps, as shown in FIG. 27.

Next, as shown in FIG. 28, a layer 219 of oxide etch resistant material, such as silicon nitride, is selectively formed on the structure of FIG. 27, so that it effectively encapsulates each of the dice 214, coating both passivating layer 192 and sidewalls of the trench pattern. Nitride layer 219 is selectively formed so that a floor portion 218 of the trench pattern remains uncoated, thereby exposing the buried insulator layer 199 at that surface region. The structure is then immersed in an oxide etchant, such as a concentrated HF solution, which attacks oxide layer 199 via exposed floor portion 218 of the trench pattern, so as to etch away the buried oxide layer and thereby lift-off the plurality of dice 214 from the underlying support substrate 211. Because buried oxide layer 199 is doped with impurities, such as phosphorus, which accelerate the action of the HF etch, oxide layer 199 is readily removed.

As will be appreciated from the foregoing description, applying the dice-patterning and removal techniques of the respective embodiments of the '091 application to the electroplated sidewall wafer structure obtained in accordance with the process described in the '388 application make it unnecessary to handle the wafer throughout its processing sequence, thereby substantially preventing damage to the considerably 'thinned' integrated circuit-containing dice, whose reduced physical size allows the resolution of an associated focal plane array to be optimized in a substantially reduced volume packaging arrangement, so as to provide a considerably enhanced resolution optical signal processor.

While we have shown and described several embodiments in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. A method of forming an edge connector to a semiconductor substrate having comprising the steps of:
    (a) forming, in said semiconductor substrate, a region of material capable of being bonded with conductive material;
    (b) forming a trench pattern in a first surface of said semiconductor substrate so as to expose a sidewall portion of said region;
    (c) bonding conductive material to said sidewall portion of said region;
    (d) forming a layer of a prescribed material in said trench pattern;
    (e) mounting said semiconductor substrate on a support member such that the first surface of said semiconductor substrate faces said support member;
    (f) removing material from a second surface of said semiconductor substrate, opposite to said first surface thereof, so as to effect a thinning of said substrate down to a level which exposes said prescribed material in said trench pattern;
    (g) removing said prescribed material from said trench pattern, thereby leaving a plurality of spaced apart semiconductor dice that are supported by way of said support member; and
    (h) removing said plurality of dice from said support member.

2. A method according to claim 1, wherein step (e) comprises joining said semiconductor substrate to said support member by way of a layer of adhesion material that adheres said support member to said passivating layer, and step (h) comprises separating said plurality of dice from said support member by relieving the adhering property of adhesion material 3. A method according to claim 1, wherein step (c) comprises plating conductive material onto said sidewall portion of said region.

4. A method according to claim 2, wherein said adhering material comprises wax and step (h) comprises melting said wax.

5. A method according to claim 1, wherein step (d) includes the step of testing said integrated circuit components by way of exposed surface areas of said integrated circuit components.

6. A method according to claim 1, wherein step (d) comprises filling said trench pattern with a fill material the resistance of which to physical removal is greater than that of said semiconductor substrate.

7. A method according to claim 6, wherein step (d) comprises non-selectively depositing one or more layers of fill material on the structure resulting from step (c) so as to fill said trench pattern with said fill material.

8. A method according to claim 7, wherein said fill material contains at least one of silicon nitride and silicon carbide.

9. A method according to claim 6, wherein a passivating layer is formed on said first surface of said semiconductor substrate and wherein step (d) comprises non-selectively depositing a first layer of fill material on the structure resulting from step (c), so as to form said first layer of fill material in said trench and on said passivating layer, and nonselectively depositing a second layer of fill material on said first layer of fill material, so as to fill the remainder of said trench pattern with said second layer of fill material, and thereafter removing said first and second layers of fill material down to the surface of said passivating layer, so that said first and second layers of fill material remain in said trench pattern.

10. A method according to claim 9, wherein step (g) comprises etching said first layer of fill material so as to cause said second layer of fill material to be lifted out.

11. A method according to claim 1, wherein step (d) comprises forming, as said layer of prescribed material, a layer of etchable material on floor and wall portions of said trench pattern.

12. A method according to claim 1, wherein step (a) includes the steps of selectively forming a dielectric layer over said first surface of said substrate so as to expose a top surface portion of said region, and forming said conductive layer on said dielectric layer so as to extend through an aperture therein and contact said region.

13. A method of forming a metallic link to a sidewall portion of a semiconductor wafer comprising the steps of:
    (a) forming, in a first surface said wafer, a region of a metallic layer;

(b) attaching an electrode layer to a first portion of said region;

(c) forming a trench pattern in said first surface of said wafer, so as to expose a sidewall portion of said region, spaced apart from said first portion thereof;

(d) electroplating a metallic layer onto said sidewall portion of said region, using said electro layer as an electroplating electrode, while placing said side portion of said region in contact with an electroplating solution;

(e) filling said trench pattern with a trench fill material the resistance of which to physical removal is greater than that of said semiconductor wafer;

(f) adhering said semiconductor wafer, a first surface down, onto a planar support member;

(g) removing, by mechanical polishing, material from a second surface of said planar semiconductor wafer, opposite to said first surface, so as to effect a thinning of said wafer down to a level which exposes said trench fill material;

(h) removing said trench fill material from said trench pattern, so that a plurality of spaced-apart semiconductor dice are supported by way of said support member; and (i) removing said plurality of dice from said support member.

14. A method according to claim 13, wherein step (f) comprises joining said semiconductor wafer to said support member by way of a layer of adhesion material that adheres said support member to the passivating layer of said wafer, and step (i) comprises separating said plurality of dice from said support member by relieving the adhering property of said layer of adhesion material.

15. A method according to claim 14, wherein step (e) comprises non-selectively deposition a first layer of fill material on the structure resulting from step (d) so as to form said first layer of fill material in said trench and on said passivating layer, and non-selectively depositing a second layer of fill material on said first layer of fill material, so as to fill said trench pattern with said first and second layers of fill material and form said first and second layers of fill material on said passivating layer, and thereafter removing said first and second layers of fill material from said passivating layer, so that said first and second layers of fill material remain in said trench pattern.

16. A method according to claim 15, wherein step (h) comprises etching said first layer of fill material so as to cause said second layer of fill material to be lifted out.

17. A method according to claim 13, wherein step (a) comprises forming, in a first surface portion of said semiconductor wafer, a dielectrically isolated pocket of semiconductor material containing said region of doped semiconductor material, and wherein step (b) comprises attaching said electrode layer to a top surface portion of said region.

18. A method according to claim 16, wherein said semiconductor wafer has a passivating layer formed on said first surface and step (e) comprises non-selectively deposited a nitride layer on the structure resulting from step (d) so as to form said nitride layer in said trench and on said passivating layer, and removing said nitride layer from said passivating layer, so that said nitride layer is formed only in said trench pattern.

19. A method according to claim 18, wherein said semiconductor wafer has a passivating layer formed on said first surface and step (e) comprises non-selectively depositing a buffer layer of nitride on the structure resulting from step (d) so as to form said buffer layer in said trench and on said passivating layer, non-selectively depositing a further polishing stop layer on said nitride layer, so as to fill said trench pattern with polishing stop layer and form said polishing stop layer on said passivating layer, and thereafter removing said polishing stop layer and said buffer nitride layer from said passivating layer, so that said buffer nitride layer and said polishing stop layer remain as a fill layer in said trench pattern.

20. A method of manufacturing a semiconductor device comprising the steps of:

(a) providing a substrate having a semiconductor layer containing integrated circuit components formed in a first planar surface thereof, a passivating layer being formed on said first planar surface so as to extend over integrated circuit components therebeneath, and having a buried insulator layer formed beneath said integrated circuit components, said substrate having material beneath said buried insulator layer;

(b) forming a trench pattern through said passivating layer and the thickness of said semiconductor layer down to said buried insulator layer;

(c) forming a conductive layer onto a sidewall portion of said trench pattern;

(d) filling said trench pattern with a prescribed trench fill material;

(e) mounting the structure resulting from step (d) on a support member such that the first planar surface of said semiconductor layer faces said support member;

(f) removing said material of said substrate beneath said buried insulator layer so as to expose said buried insulator layer; (g) removing said buried insulator layer, thereby exposing said trench fill material in said trench pattern;

(h) removing said trench fill material from said trench pattern, so that a plurality of spaced apart semiconductor dice are supported by way of said support member; and (i) removing said plurality of dice from said support member.

21. A method according to claim 20, wherein step (d) comprises non-selectively forming said trench fill material on said first surface of said semiconductor layer and in said trench pattern.

22. A method according to claim 21, wherein said trench fill material comprises a layer of adhesion material that adheres said support member to said first surface of said semiconductor layer, and step (i) comprises separating said plurality of dice from said support member by relieving the adhering property of said adhesion material.

23. A method according to claim 22, wherein said adhesion material comprises wax and step (i) comprises melting said wax 24. A method of conductively connecting an array of photoresponsive devices that are supported within a first semiconductor substrate and for which respective conductive land portions are provided over a first surface of said first semiconductor substrate, to signal processing devices that are supported in a second semiconductor substrate comprising the steps of:

(a) forming, in said second semiconductor substrate, a plurality of regions of material capable of being plated with respective metallic layers and providing conductive connections between said regions and signal processing devices that are supported within said second semiconductor substrate;

(b) forming a trench pattern in said second semiconductor substrate, so as to expose respective sidewall portions of said regions;

(c) plating respective metallic layers to the respective sidewall portions of said regions and thereby providing a plurality of metallic land portions at sidewall portions of said second semiconductor substrate that are conductively connected to said plurality of signal processing devices supported therein;

(d) forming a layer of a prescribed material in said trench pattern;

(e) mounting said second semiconductor substrate on a support member such that the first surface of said second semiconductor substrate faces said support member;

(f) removing material from a second surface of said second semiconductor substrate, opposite to said first surface thereof, so as to effect a thinning of said second semiconductor substrate down to a level which exposes said prescribed material in said trench pattern;

(g) removing said prescribed material from said trench pattern, thereby leaving a plurality of spaced apart semiconductor dice that are supported by way of said support member;

(h) removing said plurality of dice from said support member; and (i) bringing a side edge portion of a die removed in step (h) into adjacent alignment with plural conductive land portions of said first semiconductor substrate and conductively joining said plural conductive land portions of said first semiconductor substrate with plural metallic layers that have been plated to side portions of regions of said die in step (c).

25. A method according to claim 24, wherein step (a) comprises the steps of:

(a1) forming, in a first surface portion of said second semiconductor substrate, a plurality of pockets, each of which contains a respective region of doped semiconductor material, and (a2) attaching plural conductive layers to top surface portions of respective ones of said regions.

26. A method according to claim 25, wherein step (b) comprises forming said trench pattern so as to expose sidewall portions of said regions, spaced apart from said conductive layers, and wherein step (c) comprises electroplating metallic layers onto exposed sidewall portions of said regions, using said conductive layers as electroplating electrodes, while placing the exposed sidewall portions of said regions in contact with an electroplating solution.

27. A method according to claim 24, wherein said array comprises a two-dimensional array of photoresponsive devices and step (i) comprises bringing sidewall portions of a plurality of adjacent separated dice into alignment with respective sets of plural conductive land portions of said first semiconductor substrate and conductively joining the plural conductive land portions of respective ones of said sets with plural metallic layers that have been plated to sidewall portions of regions of respective ones of said dice.

28. A method of manufacturing an opto-electronic imaging system comprising the steps of:

(a) providing a first semiconductor substrate having formed in a first surface thereof a matrix of rows and columns of photoresponsive devices and having extending from a second surface thereof an associated matrix of conductive land portions that are electrically coupled with respective ones of said photoresponsive devices;

(b) providing, for each row of said matrix of photoresponsive devices, a respective second semiconductor substrate having a semiconductor layer containing integrated circuit components formed in a first planar surface thereof which are interconnected to form signal processing devices for processing the outputs of an associated row of said matrix of photoresponsive devices, said second semiconductor substrate having a passivating layer formed on said first planar surface so as to extend over integrated circuit components therebeneath, and having a buried insulator layer formed beneath said integrated circuit components, said substrate having material beneath said buried insulator layer;

(c) forming a trench pattern through said passivating layer and the thickness of said semiconductor layer down to said buried insulator layer, so as to separate said semiconductor layer into a plurality of semiconductor dice supported on said buried insulator layer;

(d) plating a plurality of metallic bumps on sidewalls of said trench pattern, said metallic bumps being conductively connected to signal processing devices within said second semiconductor substrate;

(e) forming etch resistant material on said passivating layer and on sidewalls of said trench pattern, with a floor portion of said trench pattern exposing said buried insulator layer;

(f) applying an etchant to said buried insulator layer by way of the exposed floor portion of said trench pattern, so as to etch away said buried insulator layer and thereby remove said plurality of semiconductor dice from substrate material beneath said buried insulator layer.

(g) bringing the side edge portion of a respective removed die into adjacent alignment with plural conductive land portions of said first semiconductor substrate and conductively joining said plural conductive land portions of said first semiconductor substrate with plural metallic bumps along side portions of said respective dice.

29. A method according to claim 28, wherein said buried insulator layer is doped with impurities that accelerate the etching of said buried insulator layer by said etchant.

30. A method according to claim 28, wherein step (f) comprises immersing the structure resulting from step (e) in an etchant solution, so as to etch said buried insulator layer by way of the exposed floor portion of said trench pattern, and thereby remove said plurality of semiconductor dice from substrate material beneath said buried insulator layer.

* * * * *